(12) United States Patent
Jing et al.

(10) Patent No.: US 10,079,584 B1
(45) Date of Patent: Sep. 18, 2018

(54) CLOSED-LOOP AUTOMATIC GAIN CONTROL IN LINEAR BURST-MODE TRANSIMPEDANCE AMPLIFIER

(71) Applicant: Futurewei Technologies, Inc., Plano, TX (US)

(72) Inventors: Lei Jing, Wuhan (CN); Peter Ossieur, Bruges (BE); Ning Cheng, Basking Ridge, NJ (US); Naresh Chand, Warren, NJ (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 15/458,698

(22) Filed: Mar. 14, 2017

(51) Int. Cl.
*H04B 10/69* (2013.01)
*H03G 3/30* (2006.01)
*H03F 3/45* (2006.01)
*H04Q 11/00* (2006.01)

(52) U.S. Cl.
CPC ....... *H03G 3/3084* (2013.01); *H03F 3/45475* (2013.01); *H04Q 11/0066* (2013.01); *H04Q 11/0067* (2013.01); *H03F 2200/462* (2013.01); *H03F 2203/45288* (2013.01)

(58) Field of Classification Search
CPC ................................................ H04B 10/6931
See application file for complete search history.

(56) References Cited

U.S. PATENT DOCUMENTS

| 6,911,644 | B2 | 6/2005 | Doh et al. |
| 9,059,807 | B2 | 6/2015 | Ossieur et al. |
| 2004/0190912 | A1* | 9/2004 | Seo ..................... H04B 10/6931 398/202 |
| 2007/0042736 | A1 | 2/2007 | Tateno et al. |
| 2009/0058519 | A1 | 3/2009 | Nishimura |

(Continued)

FOREIGN PATENT DOCUMENTS

CN 202550976 U 11/2012
EP 1032145 A2 8/2000

OTHER PUBLICATIONS

Machine Translation and Abstract of Chinese Publication No. CN202550976, Nov. 21, 2012, 6 pages.

(Continued)

*Primary Examiner* — Shi K Li
(74) *Attorney, Agent, or Firm* — Conley Rose, P.C.

(57) ABSTRACT

An optical network system comprising an optical line terminal (OLT) and an optical network unit (ONU) coupled to the OLT and configured to communicate with the OLT via an optical signal. At least one of the OLT or the ONU comprises a closed-loop gain controlled transimpedance amplifier (TIA) comprising a first amplifier configured to receive an input signal, generate a main output signal by amplifying the input signal according to a gain factor of the first amplifier, and generate an auxiliary output proportional to the input signal, an average detector coupled to the first amplifier and configured to receive the auxiliary output, and determine an average of the input signal according to the auxiliary output, and a feedback loop coupled to the first amplifier and the average detector and configured to control the gain factor of the first amplifier according to the average of the input signal.

20 Claims, 3 Drawing Sheets

(56) References Cited

U.S. PATENT DOCUMENTS

2013/0342276 A1   12/2013  Ito

OTHER PUBLICATIONS

Foreign Communication From A Counterpart Application, PCT Application No. PCT/CN2018/078288, English Translation of International Search Report dated May 30, 2018, 5 pages.
Foreign Communication From A Counterpart Application, PCT Application No. PCT/CN2018/078288, English Translation of Written Opinion dated May 30, 2018, 5 pages.

* cited by examiner

CLOSED-LOOP AUTOMATIC GAIN CONTROL IN LINEAR BURST-MODE TRANSIMPEDANCE AMPLIFIER

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

A passive optical network (PON) system is one system for providing network access over the last mile, which is the final portion of a telecommunications network that delivers communication to customers. A PON system is a point-to-many-point (P2MP) network comprising an optical line terminal (OLT) at a central location, optical network units (ONUs) at the user premises, and an optical distribution network (ODN) coupling the OLT to the ONUs. The OLT may transmit to, or receive from, the ONUs burst-mode transmissions which are transmissions lasting only tens of milliseconds in length. Upon receipt, the burst-mode transmissions are converted from an optical signal to electrical signals and processed by the receiving device.

SUMMARY

To realize high-speed PON systems, modulation formats can be used which a linear burst-mode receiver performs upstream transmission. To process electrical signals resulting from optical communications in these PON systems, transimpedance amplifiers (TIAs) are implemented. To support a large dynamic range of input signals in the PON systems, automatic gain control, high linearity, and a fast settling time may be desirable for the TIA. Presently, solutions that provide each of the desired characteristics are few. The inventive concepts disclosed herein provide for a fast settling time, high degree of linearity, and large dynamic range in an automatic gain controlled TIA.

In an embodiment, the disclosure includes an apparatus, comprising a first amplifier configured to receive an input current at a main input, generate a first amplifier output signal according to the input current and a gain of the first amplifier, and generate an auxiliary output proportional to the input current. The apparatus further comprises an average detector coupled to the first amplifier and configured to receive the auxiliary output and determine an average of the input current represented by the auxiliary output. The apparatus further comprises a second amplifier coupled to the average detector and configured to receive the average of the input current and generate a second amplifier output signal according to the average of the input current and a gain of the second amplifier. The apparatus further comprises a third amplifier coupled to the second amplifier and configured to receive the second amplifier output signal, compare the second amplifier output signal to a reference signal to determine a comparison result, and control the gain of the first amplifier and the gain of the second amplifier according to the comparison result.

Optionally, in any of the preceding embodiments, the apparatus further comprises a first feedback resistor coupled to the first amplifier and configured to provide the gain of the first amplifier, wherein a first resistance value of the first feedback resistor is controllable and a second feedback resistor coupled to the second amplifier and configured to provide the gain of the second amplifier, wherein a second resistance value of the second feedback resistor is controllable. Optionally, in any of the preceding embodiments, the apparatus further comprises a resistor controller coupled to the third amplifier, the first feedback resistor, and the second feedback resistor, wherein the resistor controller is configured to receive the comparison result from the third amplifier, determine a resistor control signal, and control the first resistance value of the first feedback resistor and the second resistance value of the second feedback resistor according to the resistor control signal to control the gain of the first amplifier and the gain of the second amplifier. Optionally, in any of the preceding embodiments, the resistor controller is further coupled to the first amplifier and the second amplifier, and wherein the resistor controller is further configured to control at least a portion of the first amplifier and the second amplifier according to the resistor control signal. Optionally, in any of the preceding embodiments, the first feedback resistor and the second feedback resistor comprise a plurality of resistors, and wherein at least one of the plurality of resistors is individually controllable by the resistor controller according to the resistor control signal to control the gain of the first amplifier and the gain of the second amplifier. Optionally, in any of the preceding embodiments, the input current is received from a photodiode. Optionally, in any of the preceding embodiments, a structure, electrical characteristics, and mechanical characteristics of the second amplifier are the same as the first amplifier. Optionally, in any of the preceding embodiments, the input current is a burst-mode signal received by an optical network unit.

In an embodiment, the disclosure includes an optical network system, comprising an OLT and an ONU coupled to the OLT and configured to communicate with the OLT via an optical signal. At least one of the OLT or the ONU comprises a closed-loop gain controlled TIA comprising a first amplifier configured to receive an input signal, generate a main output signal by amplifying the input signal according to a gain factor of the first amplifier, and generate an auxiliary output proportional to the input signal, an average detector coupled to the first amplifier and configured to receive the auxiliary output and determine an average of the input signal according to the auxiliary output, and a feedback loop coupled to the first amplifier and the average detector and configured to control the gain factor of the first amplifier according to the average of the input signal.

Optionally, in any of the preceding embodiments, the closed-loop gain controlled TIA further comprises a first feedback resistor coupled to the first amplifier, and wherein the gain factor of the first amplifier is determined according to a resistance value of the first feedback resistor. Optionally, in any of the preceding embodiments, the feedback loop comprises a second amplifier coupled to the average detector and configured to receive the average of the input signal and generate a second output signal by amplifying the average of the input signal according to a gain factor of the second amplifier, a second feedback resistor coupled to the second amplifier, wherein the gain factor of the second amplifier is determined according to a resistance value of the second feedback resistor, a third amplifier coupled to the second amplifier and configured to compare the second output signal to a reference signal to determine a comparison result, and a controller coupled to the third amplifier, the first feedback resistor, and the second feedback resistor and configured to receive the comparison result, determine a control signal according to the comparison result, and control the resistance value of the first feedback resistor and the resistance value of the second feedback resistor according to the control signal to change the gain factor of the first amplifier. Optionally, in any of the preceding embodiments, the first amplifier and the second amplifier are identical. Optionally, in any of the preceding embodiments, the controller is further coupled to the first amplifier and the second amplifier, and wherein the controller is further configured to control at least a portion of the first amplifier and the second amplifier according to the control signal. Optionally, in any of the preceding embodiments, the first feedback resistor and the second feedback resistor comprise a plurality of resistors, and wherein at least one of the plurality of resistors is individually controllable by the controller according to the control signal to control the gain of the first amplifier and the gain of the second amplifier. Optionally, in any of the preceding embodiments, the first amplifier is further coupled to a photodiode, and wherein the first amplifier receives the input signal from the photodiode.

In an embodiment, the disclosure includes a method, comprising receiving, by a first amplifier, an input signal, generating, by the first amplifier, a main output according to a gain factor, determining, by an average detector, an average of the received input signal, determining, by a feedback loop, a gain control signal according to the average of the received input signal, and modifying, by the feedback loop, the main output based on the gain control signal.

Optionally, in any of the preceding embodiments, determining the gain control signal comprises receiving, by a second amplifier, the average of the received input signal, generating, by the second amplifier, a second output according to a second gain factor, and comparing, by a third amplifier, the second output to a reference value to determine the gain control signal. Optionally, in any of the preceding embodiments, modifying the main output based on the gain control signal comprises receiving, by a controller, the gain control signal and modifying, by the controller, a resistance value of a feedback resistor configured to control the gain factor associated with the main output. Optionally, in any of the preceding embodiments, modifying the resistance value of the feedback resistor comprises controlling operation of a transistor with respect to a saturation region of the transistor. Optionally, in any of the preceding embodiments, the input signal is received from a photodiode.

For the purpose of clarity, any one of the foregoing embodiments may be combined with any one or more of the other foregoing embodiments to create a new embodiment within the scope of the present disclosure.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Disclosed herein are embodiments and means that provide for automatic gain control in a closed-loop system. At least some of the disclosed embodiments are implemented to provide closed-loop gain control for a TIA which may be operating in a burst-mode (e.g., receiving signals that include one or more bursts having a time length that can range from an order of a few tens of nanosecond to an order of tens of milliseconds). At least some of the disclosed embodiments determine a characteristic of a received signal (e.g., a strength, current level, average current level, voltage level, average voltage level, etc.), compare the determined characteristic with a reference value, generate a control signal based on the comparison, and control a gain of the TIA using the control signal. The disclosed embodiments may provide the closed-loop gain control utilizing a feedback or control loop comprising an amplifier that is a replica of the TIA for which closed-loop gain control is desired and an amplifier configured to compare a received value to a reference value. The limited quantity of components in the feedback or control loop may facilitate a comparatively fast settling time (e.g., time elapsed when determining the control signal and controlling the gain of the TIA using the control signal) when compared to known gain control methods such as feedback and/or feedforward gain control methods. The disclosed embodiments may be implemented in a single electronic chip (e.g., on a single die, substrate, or printed circuit board (PCB)) using any combination of active and/or passive electrical components. Additionally, the disclosed embodiments may be implemented as multiple electronic chips or electronic components that are coupled together, either directly or indirectly, such that the electronic components do not share a die, substrate, or PCB, and/or the electronic components are not enclosed within the same electronic chip package.

Figure 1:
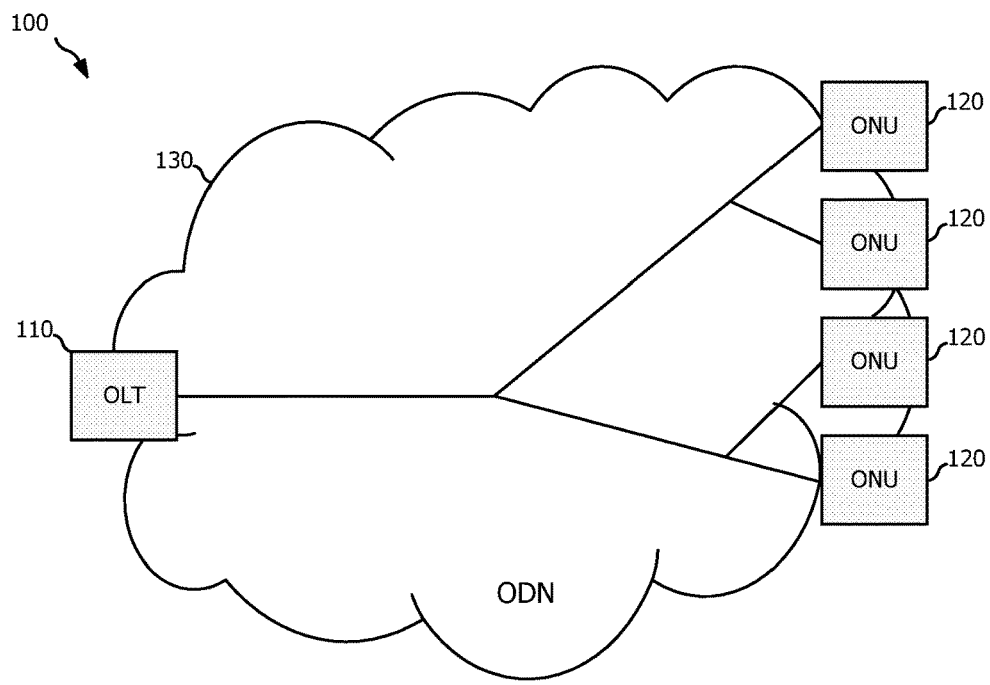
FIG. 1 is a schematic diagram of an embodiment of a PON.

Referring now to FIG. 1, an embodiment of a PON 100 is shown. The PON 100 is a communication network and comprises an OLT 110, a plurality of ONUs 120, and an ODN 130 that couples the OLT 110 to the ONUs 120. The PON 100 is suitable for implementing the disclosed embodiments.

The OLT 110 communicates with the ONUs 120 and another network. Specifically, the OLT 110 is an intermediary between the other network and the ONUs 120. For instance, the OLT 110 forwards data received from the other network to the ONUs 120 and forwards data received from the ONUs 120 to the other network. The OLT 110 comprises a transmitter and a receiver. When the other network uses a network protocol that is different from the protocol used in the PON 100, the OLT 110 comprises a converter that converts the network protocol to the PON protocol and vice versa. The OLT 110 is typically located at a central location such as a central office (CO), but it may also be located at other suitable locations.

The ODN 130 is a data distribution system that comprises optical fiber cables, couplers, splitters, distributors, and other suitable components. The components include passive optical components that do not require power to distribute signals between the OLT 110 and the ONUs 120. The components may also include active components such as optical amplifiers that do require power. The ODN 130 extends from the OLT 110 to the ONUs 120 in a branching configuration as shown, but the ODN 130 may be configured in any other suitable P2MP manner.

The ONUs 120 communicate with the OLT 110 and customers and act as intermediaries between the OLT 110 and the customers. For instance, the ONUs 120 forward data from the OLT 110 to the customers and forward data from the customers to the OLT 110. The ONUs 120 comprise optical transmitters that convert electrical signals into optical signals and transmit the optical signals to the OLT 110, and the ONUs 120 comprise optical receivers that receive optical signals from the OLT 110 and convert the optical signals into electrical signals. The ONUs 120 further comprise second transmitters that transmit the electrical signals to the customers and second receivers that receive electrical signals from the customers. ONUs 120 and ONTs are similar, and the terms may be used interchangeably. The ONUs 120 are typically located at distributed locations such as customer premises, but they may also be located at other suitable locations. Either, or both, of the OLT 110 or the ONUs 120, in some embodiments, comprise a closed-loop gain controlled TIA, for example, as discussed below with respect to FIGS. 2 and 3, to provide amplification and gain control for electrical signals resulting from received optical signals (e.g., optical signals received via a photodiode).

Figure 2:
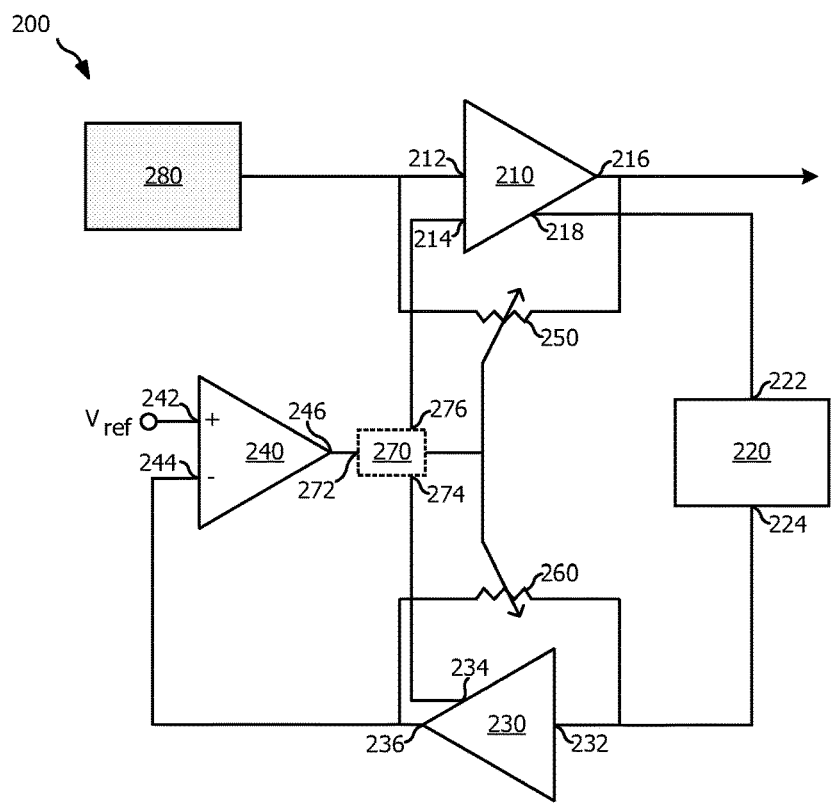
FIG. 2 is a diagram of an embodiment of an amplifier architecture.

Referring now to FIG. 2, a diagram of an embodiment of an amplifier architecture 200 is shown. The amplifier architecture 200 is implemented, in some embodiments, in an optical device such as the OLT 110 and/or any of the plurality of ONUs 120, each of FIG. 1. For example, the amplifier architecture 200 may be implemented in a front end of the optical device to provide automatic gain control of an incoming signal. It should be noted, however, that the amplifier architecture 200 may be implemented in other electronic devices seeking to provide automatic gain control of an incoming signal, and the amplifier architecture 200 is not limited to implementation in an optical device as exemplarily used herein.

The amplifier architecture 200 includes, in some embodiments, a main amplifier 210 comprising a main input 212, a control input 214, a main output 216 and an auxiliary output 218, an average current detector 220 comprising an input 222 and an output 224, a second amplifier 230 comprising a main input 232, a control input 234, and a main output 236, a third amplifier 240 comprising a first input (e.g., a non-inverting input) 242, a second input (e.g., an inverting input) 244, and an output 246, a first feedback resistor 250, and a second feedback resistor 260. Optionally, the amplifier architecture 200 further includes a resistor controller 270 comprising an input 272, a main output 274, a first control output 276, and a second control output 278. The main amplifier 210 is configured to receive an input current at the main input 212 and convert the input current to an output voltage present at the main output 216 of the main amplifier 210. In some embodiments, the main amplifier 210 may convert the input current to the output voltage based at least in part on one or more signals received at the control input 214. The input current is received at the main input 212 from any suitable electrical component 280 that is coupled to the main input 212 of the main amplifier 210 and provides a current, (e.g., such as a sensor). The particular source of the input current or type of the electrical component 280 is not limited herein.

For example, in some implementations the electrical component 280 is a photodiode configured to output a current having a relationship to a quantity of photons (e.g., from a light source such as a laser beam, optical signal, sunlight, or any other suitable source of light occurring at any suitable wavelength) absorbed by the photodiode for use by the main amplifier 210 as the input current. In some embodiments, the input current is scaled or amplified by the main amplifier 210 to form the output voltage, for example, as a function of the first feedback resistor 250. For example, when a value of the input current decreases, a resistance value of the first feedback resistor 250 may increase to compensate for the decrease in the input current and amplify the input current to form the output voltage. When the value of the input current increases, the resistance value of the first feedback resistor 250 may decrease to compensate for the increase in the input current and amplify the input current to form the output voltage. As such, a gain or amplification factor of the main amplifier 210 may be determined according to the first feedback resistor 250. It should be noted that while the main amplifier 210 is illustrated and discussed as comprising a single control input 214, the main amplifier 210 may instead comprise a plurality of control inputs 214 each configured to receive different control signals based upon a structure of the amplifier architecture 200, and a number of control inputs 214 of the main amplifier 210 is not limited herein.

The first feedback resistor 250 is coupled between the main input 212 and the main output 216. A resistance value of the first feedback resistor 250, in some embodiments, determines an amount of amplification provided by the main amplifier 210 to the input current prior to outputting the input current as the output voltage. In some embodiments, the main amplifier 210 and the first feedback resistor 250 together are referred to as a TIA. The first feedback resistor 250 is further coupled to another electrical component configured to control the resistance value of the first feedback resistor 250. In some embodiments (e.g., embodiments in which the resistor controller 270 is not present in the amplifier architecture 200), the first feedback resistor 250 is coupled to the third amplifier 240 such that an output of the third amplifier 240 controls the resistance value of the first feedback resistor 250. In other embodiments, (e.g., embodiments in which the resistor controller 270 is present in the amplifier architecture 200), the first feedback resistor 250 is coupled to the resistor controller 270 such that one or more outputs of the resistor controller 270 controls the resistance value of the first feedback resistor 250. While the first feedback resistor 250 is illustrated in FIG. 2 as being a single adjustable or controllable resistor (e.g., a potentiometer), it should be understood that the first feedback resistor 250 is merely representative of an amount of resistance and may be implemented as any number of passive or active electrical components each having some amount of resistance. For example, the first feedback resistor 250 may be implemented as a plurality of resistors coupled together in any series and/or parallel combination, such as parallel and/or series coupled potentiometers, parallel-coupled resistors that are each coupled in series with a transistor such that the transistor functions as a switch to switch the resistors into, or out of, the parallel coupling to increase, or decrease, the resistance value of the first feedback resistor 250, etc. Furthermore, when the first feedback resistor 250 comprises multiple electrical components, each of those electrical components may be individually controllable to selectively increase or decrease an effective amount of resistance represented by the first feedback resistor 250. For example, the first feedback resistor 250 may be implemented as a plurality of resistors coupled in parallel, where each respective resistor is further coupled in series with a transistor that functions as a switch to selectively couple or decouple the respective resistor into or out of the parallel combination of resistors, thereby increasing and/or decreasing a resistance value of the parallel combination of resistors and correspondingly the first feedback resistor 250.

The main amplifier 210 is further configured to convert the input current to an auxiliary output voltage present at the auxiliary output 218 of the main amplifier 210. In some embodiments, the auxiliary output voltage is linearly proportional to the input current such that changes in the input current are correspondingly reflected in the auxiliary output voltage without regard to a resistance value of the first feedback resistor 250. In some embodiments, a value of the auxiliary output voltage is less than a value of the input current and the linearly proportional relationship between the input current and the auxiliary output voltage may be determined according to internal characteristics of the main amplifier 210. For example, the main amplifier 210 may include one or more components (e.g., such as a load resistor, discussed below with respect to FIG. 3) that set a value of the auxiliary output voltage with respect to the input current. In some embodiments, the one or more components set the value of the auxiliary output voltage with respect to the input current sufficiently small enough that the auxiliary output voltage remains linearly proportional to the input current across a full dynamic range of possible input currents that may be received at the main input 212 of the main amplifier 210.

The average current detector 220 is coupled, via the input 222, to the auxiliary output 218 of the main amplifier 210 and configured to convert the auxiliary output voltage present at the auxiliary output 218 of the main amplifier 210 to an average current signal. For example, the average current detector 220 receives the auxiliary output voltage from the main amplifier 210, detects an average of the auxiliary output voltage, converts the detected average of the auxiliary output voltage to a current signal, and outputs the current signal as the average current signal via the output 224. In some embodiments, the average current signal is substantially similar to the input current received by the main amplifier 210 (e.g., such that a value of the average current signal is substantially representative of a value of the input current received by the main amplifier 210). The average current detector 220 may detect the average of the auxiliary output voltage and converts the detected average of the auxiliary output voltage to the current signal according to any suitable means, a particular hardware structure and/or method of which is not limited herein. An example of one embodiment of an average current detector suitable for implementation as the average current detector 220 is illustrated and discussed below with respect to FIG. 3.

The second amplifier 230 is coupled, via the main input 232, to the output 224 of the average current detector 220. The second amplifier 230 is, in some embodiments, structurally similar and/or identical to the main amplifier 210. For example, the second amplifier 230 may have characteristics (e.g., structure, electrical characteristics, mechanical characteristics, transimpedance, etc.) that are substantially the same or identical to characteristics of the main amplifier 210 such that a response of the second amplifier 230 to the average current signal received at the main input 232 from the average current detector 220 is substantially similar to a response of the main amplifier 210 to the average current signal received at the main input 212 from the electrical component 280.

The second amplifier 230 is configured to receive the average current signal at the main input 232 from the average current detector 220 and convert the average current signal to an output voltage present at the main output 236 of the second amplifier 230. In some embodiments, the second amplifier 230 may convert the input current to form the output voltage based at least in part on one or more signals received at the control input 234. In some embodiments, the average current signal is scaled or amplified by the second amplifier 230 to form the output voltage, for example, as a function of the second feedback resistor 260. For example, when a value of the input current decreases, a resistance value of the second feedback resistor 260 may increase to compensate for the decrease in the input current and amplify the input current to form the output voltage. When the value of the input current increases, the resistance value of the second feedback resistor 260 may decrease to compensate for the increase in the input current and amplify the input current to form the output voltage. As such, a gain or amplification factor of the second amplifier 230 may be determined according to the second feedback resistor 260. By having substantially the same characteristics, receiving substantially similar inputs, functioning in a substantially similar manner, and outputting a substantially similar output, the second amplifier 230 is configured to be a substantially identical replica of the main amplifier 210. It should be noted that while the second amplifier 230 is illustrated and discussed as comprising a single control input 234, the second amplifier 230 may instead comprise a plurality of control inputs 234 each configured to receive different control signals based upon a structure of the amplifier architecture 200. The number of control inputs 234 of the second amplifier 230 is not limited herein.

The second feedback resistor 260 is coupled between the main input 232 and the main output 236. A resistance value of the second feedback resistor 260, in some embodiments, determines an amount of amplification provided by the second amplifier 230 to the average current signal prior to outputting the average current signal as the output voltage. In some embodiments, the second amplifier 230 and the second feedback resistor 260 together are referred to as a TIA. The second feedback resistor 260 is further coupled to another electrical component configured to control the resistance value of the second feedback resistor 260. For example, the electrical component to which the second feedback resistor 260 is coupled for control, in some embodiments, is the same electrical component to which the first feedback resistor 250 is coupled to for control such that substantially similar control is exerted over both the first feedback resistor 250 and the second feedback resistor 260 to cause a resistance value of the first feedback resistor 250 and the second feedback resistor 260 to be substantially the same at a given point in time. In some embodiments (e.g., embodiments in which the resistor controller 270 is not present in the amplifier architecture 200), the second feedback resistor 260 is coupled to the third amplifier 240 such that an output of the third amplifier 240 controls the resistance value of the second feedback resistor 260. In other embodiments, (e.g., embodiments in which the resistor controller 270 is present in the amplifier architecture 200), the second feedback resistor 260 is coupled to the resistor controller 270 such that one or more outputs of the resistor controller 270 controls the resistance value of the second feedback resistor 260.

While the second feedback resistor 260 is illustrated in FIG. 2 as being a single adjustable or controllable resistor (e.g., a potentiometer), it should be understood that the second feedback resistor 260 is merely representative of an amount of resistance and may be implemented as any number of passive or active electrical components each having some amount of resistance. For example, the second feedback resistor 260 may be implemented as a plurality of resistors coupled together in any series and/or parallel combination, such as parallel and/or series coupled potentiometers, parallel-coupled resistors that are each coupled in series with a transistor such that the transistor functions as a switch to switch the resistors into, or out of, the parallel coupling to increase, or decrease, the resistance value of the second feedback resistor 260, etc. Furthermore, when the first feedback resistor 250 comprises multiple electrical components, each of those electrical components may be individually controllable to selectively increase or decrease an effective amount of resistance represented by the second feedback resistor 260. For example, the second feedback resistor 260 may be implemented as a plurality of resistors coupled in parallel, where each respective resistor is further coupled in series with a transistor that functions as a switch to selectively couple or decouple the respective resistor into or out of the parallel combination of resistors, thereby increasing and/or decreasing a resistance value of the parallel combination of resistors and correspondingly the second feedback resistor 260. In some embodiments, a structure and/or configuration of the second feedback resistor 260 is substantially the same as the first feedback resistor 250. For example, such that a control signal received by the second feedback resistor 260 and the first feedback resistor 250 that causes a change in the resistance value of the second feedback resistor 260 from a first resistance value to a second resistance value also causes a corresponding change to the resistance value of the first feedback resistor 250 from substantially the first resistance value to substantially the second resistance value.

The third amplifier 240 is coupled, via the second input 244, to the main output 236 of the second amplifier 230 and configured to receive the output voltage of the second amplifier 230. In some embodiments, the third amplifier 240 is further coupled, via the main output 236, to the first feedback resistor 250 and the second feedback resistor 260. In other embodiments, the third amplifier 240 is further coupled, via the main output 236, to input 272 of the resistor controller 270. The third amplifier 240 receives a reference voltage ($V_{ref}$) at the first input 242. The reference voltage is received from any suitable passive and/or active electrical component or combination of components (not shown). For example, the reference voltage may be received from a voltage regulator, a voltage divider, a processor (or microprocessor), a voltage source, an integrated circuit, or any other suitable electrical component or components capable of providing a reference voltage. The reference voltage, in some embodiments, has a value corresponding to a desired value of the output voltage present at the main output 216 of the main amplifier 210 and the output voltage present at the main output 236 of the second amplifier 230.

The third amplifier 240, in some embodiments, is implemented as an operational amplifier configured to compare the reference voltage received at the first input 242 to the output voltage of the second amplifier 230 received at the second input 244 and generate a comparison output voltage present at the output 246 based on the comparison. In other embodiments, the third amplifier 240 may be any electrical component suitable for receiving two inputs and providing an output based on a comparison and/or difference between the two inputs. The comparison output voltage present at the output 246 is, in some embodiments (e.g., embodiments in which the resistor controller 270 is not present in the amplifier architecture 200), configured to control the resistance value of the first feedback resistor 250 and the second feedback resistor 260 and, as such, may be referred to as a control signal. When the third amplifier 240 determines that the output voltage of the second amplifier 230 is less than the reference voltage, the control signal causes the resistance value of the first feedback resistor 250 and the second feedback resistor 260 to increase, thereby increasing a gain or amount of amplification of the main amplifier 210 and the second amplifier 230, respectively. Correspondingly, when the third amplifier 240 determines that the output voltage of the second amplifier 230 is greater than the reference voltage, the control signal causes the resistance value of the first feedback resistor 250 and the second feedback resistor 260 to decrease, thereby decreasing the gain or amount of amplification of the main amplifier 210 and the second amplifier 230, respectively. The third amplifier 240 may perform the comparison between the reference voltage and the output voltage of the second amplifier 230 according to any suitable means, a particular hardware structure and/or method of which is not limited herein.

The resistor controller 270 is included in the amplifier architecture 200 when, for example, the first feedback resistor 250 and the second feedback resistor 260 include a plurality of resistors or other electrical components that are individually controllable (e.g., via transistors implemented as switches, as discussed above). The resistor controller 270, when present in the amplifier architecture 200, is coupled via the input 272 to the output 246 of the third amplifier 240. The resistor controller 270 is further coupled to the first feedback resistor 250 and the second feedback resistor via the main output 274, to control input 214 of the main amplifier 210 via the first control output 276, and to the control input 234 of the second amplifier 230 via the second control output 278.

While illustrated as a single coupling between the resistor controller 270 and each of the first feedback resistor 250 and the second feedback resistor 260, it should be understood that there may be any number of couplings present between the resistor controller 270 and each of the first feedback resistor 250 and the second feedback resistor 260 based on a structure of the first feedback resistor 250 and the second feedback resistor 260. For example, the number of couplings may be based on a number of individually controllable resistors or other electrical components included in each of the first feedback resistor 250 and the second feedback resistor 260. As such, while the resistor controller 270 is illustrated and discussed as comprising a singular main output 274, the resistor controller 270 may instead comprise a plurality of main outputs 274, each of which is configured to output a voltage signal, each of which may sometimes be referred to as a control signal. The plurality of main outputs 274 may each be configured to control a corresponding resistor or electrical component of the first feedback resistor 250 and/or the second feedback resistor 260 and each may be transmitted to the main amplifier 210 and/or the second amplifier 230. Additionally, while illustrated as a single coupling between the resistor controller 270 and each of the main amplifier 210 and the second amplifier 230, it should be understood that there may be any number of couplings present between the resistor controller 270 and each of the main amplifier 210 and the second amplifier 230 based on a structure of the amplifier architecture 200. For example, the number of couplings may be based on a number of individually controllable resistors or other electrical components included in each of the first feedback resistor 250 and the second feedback resistor 260 and/or a number of control signals determined by the resistor controller 270.

The resistor controller 270, in some embodiments, is configured to receive the comparison output voltage from the third amplifier 240 and form one or more control signals based on the comparison output voltage and a structure of the first feedback resistor 250 and the second feedback resistor 260. For example, when the first feedback resistor 250 and the second feedback resistor 260 each comprise a plurality of individually controllable electrical components the resistor controller 270 is configured to determine a control signal for each of the individually controllable electrical components of the first feedback resistor 250 and the second feedback resistor 260. For example, when the resistor controller 270 receives a comparison output voltage from the third amplifier 240 having a value of X volts, and the first feedback resistor 250 and the second feedback resistor 260 may each include 4 individually controllable electrical components. In such embodiments, the resistor controller 270 may provide control signals having values of about X volts, about X/2 volts, about X/3 volts, and about X/4 volts to the first, second, third, and fourth individually controllable electrical components, respectively, of each of the first feedback resistor 250 and the second feedback resistor 260. It should be noted, however, that the above values are merely exemplary and are not intended to limit the scope of the present disclosure in any way. Instead, the resistor controller 270 may be any electrical component suitable for receiving an input voltage and providing one or more output voltages substantially based on the input voltage. For example, the resistor controller 270 may be implemented as, or include, a voltage divider, a resistor ladder, a voltage regulator, a processor (or micro-processor), a voltage source, an integrated circuit, or any other suitable electrical component or components capable of receiving an input voltage and providing one or more output voltages substantially based on the input voltage. The resistor controller 270 may further provide any number of the determined control signals to the main amplifier 210 and the second amplifier 230, for example, as control inputs, for use by the main amplifier 210 and the second amplifier 230 in processing received signals to determine output signals.

Figure 3:
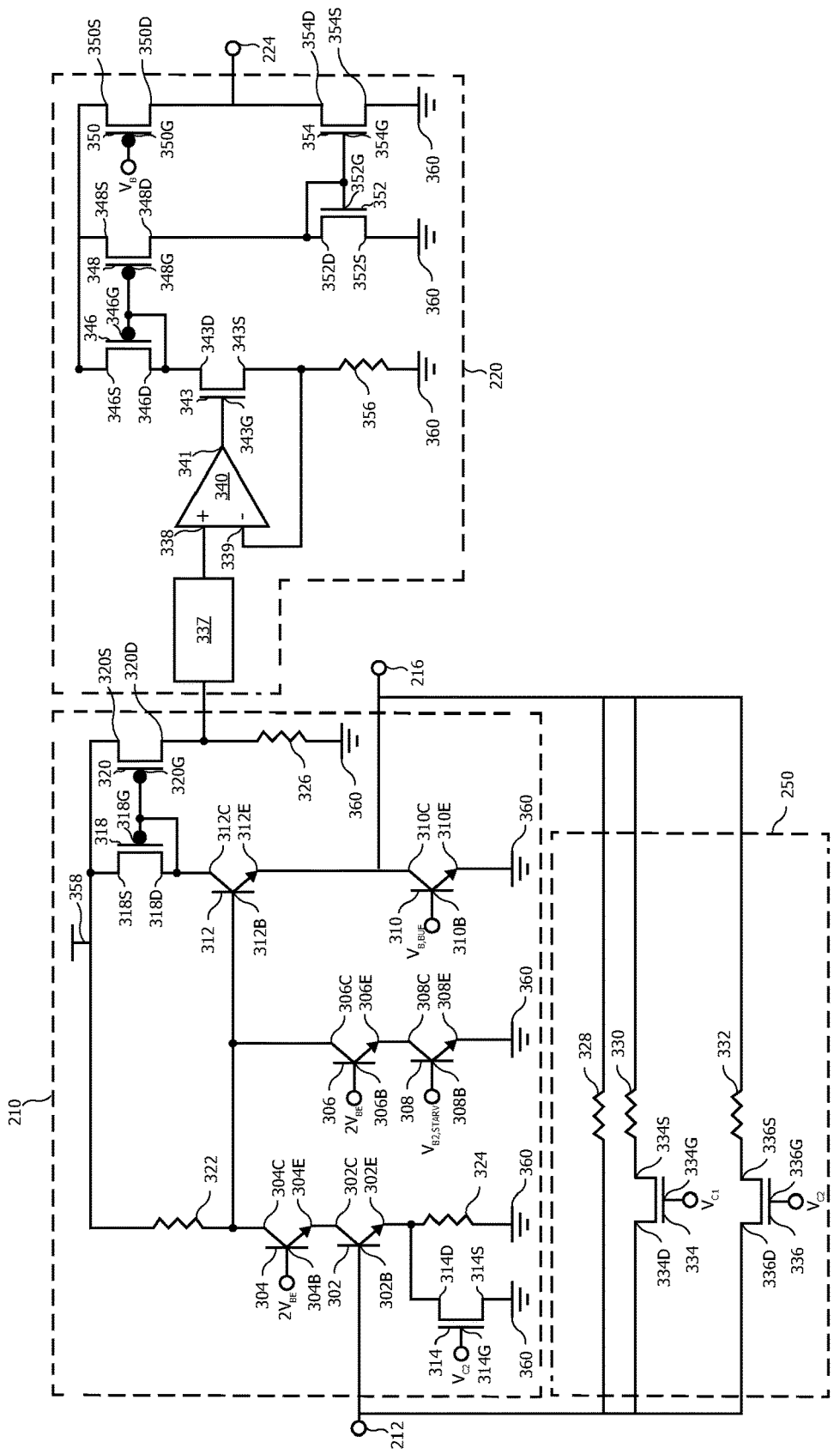
FIG. 3 is a partial schematic diagram of an embodiment of the amplifier architecture.

Referring now to FIG. 3, a partial schematic diagram of an embodiment of the amplifier architecture 200 is shown. As shown in FIG. 3, the main amplifier 210 comprises a plurality of NPN-type bipolar junction transistors (BJTs) 302, 304, 306, 308, 310, and 312 (302-312), a n-type metal oxide semiconductor field effect transistor (NMOS) 314, p-type metal oxide semiconductor field effect transistors (PMOS) 318 and 320 (which when coupled as shown in FIG. 3. May be referred to as a current mirror), adjustment resistors 322 and 324, and load resistor 326. Each of the BJTs 302-312 respectively comprises a base 3xxB, a collector 3xxC, and an emitter 3xxE (e.g., the BJT 302 comprises base 302B, collector 302C, and emitter 302E, the BJT 304 comprises base 304B, collector 304C, and emitter 304E, etc.). The NMOS 314 and the PMOS 318 and 320 each respectively comprise a gate 3xxG, drain 3xxD, and source 3xxS.

When the BJTs 302-312 receive a voltage at the base 302B-312B, respectively (and referred to herein, respectively, as 3xxB) that exceeds a voltage present at the emitter 302E-312E, respectively (and referred to herein, respectively, as 3xxE) plus a threshold voltage (e.g., a threshold voltage of 0.7 volts or any other threshold voltage determined according to characteristics of the individual BJTs 302-312), the BJTs 302-312 operate in a saturation region. When operating in the saturation region, substantially all current received at the collector 302C-312C, respectively (and referred to herein, respectively, as 3xxC) and the base 3xxB flows through the respective BJT 302-312 to the emitter 3xxE. When operating in the saturation region, the BJTs 302-312 may be referred to as being "on" and providing the voltage to the base 3xxB that causes the BJT 302-312 to operate in the saturation region may be referred to as "turning on" the respective BJT 302-312. When the BJTs 302-312 receive a voltage at the base 3xxB that does not exceed the voltage present at the emitter 3xxE plus the threshold voltage, the BJTs 302-312 operate in a cutoff region in which substantially no current received at the collector 3xxC or the base 3xxB flows through the respective BJT 302-312 to the emitter 3xxE. When operating in the cutoff region, the BJTs 302-312 may be referred to as being "off" and providing the voltage to the base 3xxB that causes the BJT 302-312 to operate in the cutoff region may be referred to as "turning off" the respective BJT 302-312. In this manner, each of the BJTs 302-312 may be considered as a switch that, when turned on, functions as a substantially short-circuited switch (e.g., minus any associated voltage drop occurring across the respective BJT 302-312) that enables current to flow and that, when turned off, functions as a substantially open circuit that inhibits and/or restricts the flow of current.

Similarly, when a voltage differential between the gate 314G and the source 314S of the NMOS 314 exceeds a threshold voltage, the NMOS 314 enters a saturation region in which substantially all current received at the drain 314D flows through the NMOS 314 to the source 314S. When operating in the saturation region, the NMOS 314 may be referred to as being "on" and providing the voltage to the gate 314G that causes the NMOS 314 to operate in the saturation region may be referred to as "turning on" the NMOS 314. When the voltage differential between the gate 314G and the source 314S of the NMOS 314 does not exceed the threshold voltage, the NMOS 314 enters a cutoff region in which substantially no current received at the drain 314D flows through the NMOS 314 to the source 314S. When operating in the cutoff region, the NMOS 314 may be referred to as being "off" and providing the voltage to the gate 314G that causes the NMOS 314 to operate in the cutoff region may be referred to as "turning off" the NMOS 314. Conversely, when a voltage differential between the gate 318G or 320G and the source 318S or 320S of the PMOS 318 or 320, respectively, does not exceed a threshold voltage, the PMOS 318 or 320 enters a saturation region in which substantially all current received at the source 318S or 320S flows through the respective PMOS 318 or 320 to the respective drain 318D or 320D. When operating in the saturation region, the PMOS 318 or 320 may be referred to as being "on" and providing the voltage to the gate 318G or 320G that causes the respective PMOS 318 or 320 to operate in the saturation region may be referred to as "turning on" the respective PMOS 318 or 320. When the voltage differential between the gate 318G or 320G and the source 318S or 320S of the respective PMOS 318 or 320 exceeds the threshold voltage, the respective PMOS 318 or 320 enters a cutoff region in which substantially no current received at the source 318S or 320S flows through the respective PMOS 318 or 320 to the drain 318D or 320D. When operating in the cutoff region, the PMOS 318 or 320 may be referred to as being "off" and providing the voltage to the gate 318G or 320G that causes the respective PMOS 318 or 320 to operate in the cutoff region may be referred to as "turning off" the PMOS 318 or 320.

BJT 302 is coupled, via the base 302B, to the electrical component 280 (shown in FIG. 2) such that the base 302B is the main input 212 of the main amplifier 210 as discussed in FIG. 2. The BJT 302 is also coupled to the adjustment resistor 324 and the drain 314D of the NMOS 314 via the emitter 302E, as well as the emitter 304E of the BJT 304 via the collector 302C. The BJT 304 is coupled, via the collector 304C, to the adjustment resistor 322, the collector 306C of the BJT 306, the base 312B of the BJT 312, and the BJT 302 as previously discussed. Additionally, the BJT 304 receives a reference or bias voltage at the base 304B, a particular value of which is dependent upon a construction of the amplifier architecture 200 and is not limited herein. In some embodiments, the reference voltage is two times the threshold voltage ($2V_{BE}$) that determines the BJT 304's operation with respect to the saturation region, as previously discussed. The BJT 306 is coupled, via the collector 306C, to the collector 304C of the BJT 304 as previously discussed, the adjustment resistor 322, and the base 312B of the BJT 312. The BJT 306 is also coupled to the collector 308C of the BJT 308 via the emitter 306E. Additionally, the BJT 306 receives a reference or bias voltage at the base 306B, a particular value of which is dependent upon a construction of the amplifier architecture 200 and is not limited herein. In some embodiments, the reference voltage is substantially the same as the reference voltage received by the BJT 304 at the base 304B, for example, $2V_{BE}$. The BJT 308 is coupled, via the collector 308C, to the BJT 306 as previously discussed, and by the emitter 308E to a ground potential 360. Additionally, the BJT 308 receives a reference or bias voltage ($V_{B2,STARV}$) at the base 308B, a particular value of which is dependent upon a construction of the amplifier architecture 200 and is not limited herein. In some embodiments, a value of the reference voltage is determined, at least in part, according to an amount of resistance present in the first feedback resistor 250. For example, when the first feedback resistor 250 comprise a plurality of individually controllable electrical components, the reference voltage received at the base 308B of the BJT 308 may be linearly proportional to a control signal (e.g., a first control signal produced by the resistor controller 270 of FIG. 2 and received by the main amplifier 210 at the control input 214).

The BJT 310 is coupled, via the collector 310C, to the emitter 312E of the BJT 312 and to the feedback resistor 250. The BJT 310 is also coupled, via the emitter 310E, to the ground potential 360. The output voltage of the main amplifier 210 (e.g., as present at the main output 216), in some embodiments, is taken from the collector 310C of the BJT 310 such that a voltage present at the collector 310C of the BJT 310 is substantially the same as the output voltage of the main amplifier 210. Additionally, the BJT 310 receives a reference or bias voltage ($V_{B,BUF}$) at the base 310B, a particular value of which is dependent upon a construction of the amplifier architecture 200 and is not limited herein. In some embodiments, the value of the reference voltage may be chosen such that the BJT 310 operates in the saturation region at all times in which the amplifier architecture 200 is active. In other embodiments, the value of the reference voltage may be tied to another electrical component or condition in the amplifier architecture 200 such that a state of that respective electrical component or a value of another signal in, or received by, the amplifier architecture 200 determines, or is used as, the reference voltage received at the base 310B of the BJT 310.

The BJT 312 is coupled, via the emitter 312E, to the collector 310C of the BJT 310 and to the feedback resistor 250 such that the output voltage of the main amplifier 210 that is present at the collector 310C of the BJT 310 is also present at the emitter 312E of the BJT 312. The BJT 312 is also coupled, via the base 312B, to the collector 306C of the BJT 306, the collector 304C of the BJT 304, each as previously discussed, as well as to the adjustment resistor 322. The BJT is further coupled, via the collector 312C, to the drain 318D and the gate 318G of the PMOS 318, as well as the gate 320G of the PMOS 320. The NMOS 314 is coupled, via the drain 314D, to the emitter 302E of the BJT 302 and the adjustment resistor 324, and via the source 314S to the ground potential 360. Additionally, the NMOS 314 receives a reference or bias voltage ($V_{C2}$) at the gate 314G, a particular value of which is dependent upon a construction of the amplifier architecture 200 and is not limited herein. In some embodiments, a value of the reference voltage is determined according to an amount of resistance present in the first feedback resistor 250. For example, when the first feedback resistor 250 comprise a plurality of individually controllable electrical components, the reference voltage received at the gate 314G of the NMOS 314 may be linearly proportional to a control signal (e.g., a second control signal produced by the resistor controller 270 of FIG. 2 and received by the main amplifier 210 at the control input 214). In some embodiments, the reference voltage received at the gate 314G of the NMOS 314 is substantially the same as the reference voltage received at the base 308B of the BJT 308, while in other embodiments the reference voltages are different.

The PMOS 318 is coupled, via the source 318S, to a voltage source 358 and the source 348S of the PMOS 348, and via the drain 318D to the collector 312C of the BJT 312, the gate 318G, and the gate 320G of the PMOS 320. The PMOS 320 is coupled, via the source 320S, to the voltage source 358 and the source 318S of the PMOS 318, via the gate 320G to the gate 318G and the drain 318D of the PMOS 318 and to the collector 312C of the BJT 312, and via the drain 320D to the load resistor 326. The auxiliary output voltage of the main amplifier 210 (e.g., as present at the auxiliary output 218), in some embodiments, is taken from the source 320S of the PMOS 320 such that a voltage present at the source 320S of the PMOS 320 is substantially the same as the auxiliary output voltage of the main amplifier 210. Together, the PMOS 318 and the PMOS 320 comprise a current mirror configured to mirror or copy a current that passes through the PMOS 318 so that a substantially same current passes through the PMOS 320 as passes through the PMOS 318.

The adjustment resistor 322 is coupled between the voltage source 358 and the collector 304C of the BJT 304, the collector 306C of the BJT 306, and the base 312B of the BJT 312. The adjustment resistor 324 is coupled between the ground potential 360 and the emitter 302E of the BJT 302 and the drain 314D of the NMOS 314. The load resistor 324 is coupled between the drain 320D of the PMOS 320 and the ground potential 360.

As also shown in FIG. 3, in some embodiments the first feedback resistor 250 comprises a plurality of electrical components such that the resistance value of the first feedback resistor 250 may be increased and/or decreased as discussed above. It should be noted that the configuration of the first feedback resistor 250 shown in FIG. 3 is merely exemplary and reference is made to the above discussions with respect to FIG. 2 of the first feedback resistor 250 for a more complete discussion of the various embodiments of the first feedback resistor 250. As shown in FIG. 3, the first feedback resistor 250 comprises a first resistor 328, a second resistor 330, and a third resistor 332. The first feedback resistor 250 further comprises a NMOS 334 and a NMOS 336. The NMOS 334 and the NMOS 336 may function in a substantially similar manner to the NMOS 314, discussed above. The first resistor 328 is coupled between the collector 310C of the BJT 310 and the base 302B of the BJT 302 (e.g., between the main output 216 and the main input 212 of the main amplifier 210). The second resistor 330 is coupled between the collector 310C of the BJT 310 and the source 334S of the NMOS 334. The NMOS 334 is coupled, via the source 334S to the second resistor 330 and via the drain 334D to the base 302B of the BJT 302. Additionally, the NMOS 334 is coupled, via the gate 334G, to the resistor controller 270 (not shown) of FIG. 2 such that the NMOS 334 receives a control signal at the gate 334G (e.g., a first control signal produced by the resistor controller 270 of FIG. 2, as discussed above and illustrated in FIG. 3 as $V_{C1}$) to operate the NMOS 334 as a switch, as discussed above, to selectively couple or decouple the second resistor 330 in parallel with the first resistor 328 and/or the third resistor 332 to change the resistance value of the first feedback resistor 250. The third resistor 332 is coupled between the collector 310C of the BJT 310 and the source 336S of the NMOS 336. The NMOS 336 is coupled, via the source 336S to the third resistor 332 and via the drain 336D to the base 302B of the BJT 302. Additionally, the NMOS 336 is coupled, via the gate 336G, to the resistor controller 270 (not shown) of FIG. 2 such that the NMOS 336 receives a control signal at the gate 336G (e.g., a second control signal produced by the resistor controller 270 of FIG. 2 and discussed above and illustrated in FIG. 3 as $V_{C2}$) to operate the NMOS 336 as a switch, as discussed above, to selectively couple or decouple the third resistor 332 in parallel with the first resistor 328 and/or the second resistor 330 to change the resistance value of the first feedback resistor 250. It should be understood that the first feedback resistor 250 may comprise any number of resistor and transistor combinations to enable selection of a plurality of resistance values for the first feedback resistor 250. Additionally, it should be further noted that while the NMOS 334 and NMOS 336 are illustrated as NMOS transistors, they may instead be implemented as any combination of BJT transistors and/or PMOS transistors and each transistor and resistor pair of the first feedback resistor 250 may utilize different NMOS, PMOS, BJT, and/or other suitable controllable switches without limitation.

As also shown in FIG. 3, the average current detector 220 comprises a burst-mode average detector 337, an amplifier 340 comprising a first input (e.g., a non-inverting input) 338, a second input (e.g., an inverting input) 339, and an output 341, PMOS 346, 348, and 350, NMOS 343, 352, and 354, and a load resistor 356. The NMOS 343, 352, and 354 may function in a substantially similar manner to the NMOS 314, discussed above, and the PMOS 346, 348, and 350 may function in a substantially similar manner to the PMOS 318 and 320, discussed above. The burst-mode average detector 337 is coupled between the drain 320D of the PMOS 320 and the first input 338 of the amplifier 340. The burst-mode average detector 337 is any suitable electrical component capable of determining an average of burst-mode voltage and/or current signals according to any suitable means, a particular hardware structure and/or method of which is not limited herein. For example, the burst-mode average detector 337 may be implemented as a low-pass filter that may convert a received current signal into a voltage output signal, an integrator, sample and hold circuitry, or any other suitable electrical component or means for determining an average of a burst-mode signal. The amplifier 340 is coupled, via the first input 338, to the burst-mode average detector 337, via the output 341 to a gate 343G of the NMOS 343, and via the second input 339 to a source 343S of the NMOS 343 and the load resistor 356. The NMOS 343 is coupled to the amplifier 340 as discussed above, to the load resistor 356 via the source 343S, and via the drain 343D to the drain 346D and gate 346G of the PMOS 346 and the gate 348G of the PMOS 348.

The PMOS 346 is coupled, via the source 346S, to the source 348S of the PMOS 348 and the source 350S of the PMOS 350, via the drain 346D to the drain 343D of the NMOS 343, the gate 346G, and the gate 348G of the PMOS 348. The PMOS 348 is coupled, via the source 348S, to the source 346S of the PMOS 346 and the source 350S of the PMOS 350, via the gate 348G to the gate 346G and the drain 346D of the PMOS 346 and to the drain 343D of the NMOS 343, and via the drain 320D to the drain 352D and gate 352G of the NMOS 352 and the gate 354G of the NMOS 354. Together, the PMOS 346 and the PMOS 348 comprise a current mirror configured to mirror or copy a current that passes through the PMOS 346 so that a substantially same current passes through the PMOS 348 as passes through the PMOS 346. The PMOS 350 is coupled, via the source 350S, to the source 346S of the PMOS 346 and the source 348S of the PMOS 348, and via the drain 350D to the drain 354D of the NMOS 354. Additionally, the PMOS 350 receives a reference or bias voltage ($V_B$) at the gate 350G, a particular value of which is dependent upon a construction of the amplifier architecture 200 and is not limited herein. In some embodiments, the reference voltage received at the gate 350G is a voltage sufficient to cause the PMOS 350 to operate in the saturation region, as previously discussed, while in other embodiments the voltage reference is sufficient to cause the PMOS 350 to operate in an active region existing between the saturation region and the cutoff region, such that a current that passes through the PMOS 350 from the source 350S to the drain 350D (e.g., a current conducted by the PMOS 350) is substantially equal to a bias current associated with the BJT 310 (e.g., a bias current present at the base 310B, collector 310C, or emitter 310E). The NMOS 352 is coupled, via the drain 352D, to the drain 348D of the PMOS 348, the gate 352G, and the gate 354G of the NMOS 354, via the gate 352G to the drain 352D and the gate 354G of the NMOS 354, and via the source 352S to the ground potential 360. The NMOS 354 is coupled, via the drain 354D, to the drain 350D of the PMOS 350, via the gate 354G to the gate 352G and drain 352D of the NMOS 352 and the drain 346D of the PMOS 346, and via the source 354S to the ground potential 360. The load resistor 356 is coupled between the second input 339 of the amplifier 340, the source 343S of the NMOS 343, and the ground potential 360. In some embodiments, the load resistor 356 has a substantially same value of resistance as the load resistor 326, while in other embodiments the load resistor 356 and load resistor 326 have different values of resistance.

The voltage source 358 is provided by any suitable electrical component (e.g., a voltage regulator, power supply, or other source of voltage) and has any suitable value which may depend on a structure of the amplifier architecture 200. As such, a particular source and value of the voltage source 358 is not limited herein. In some embodiments, the source voltage may have a value of about 3.3 volts. The ground potential 360 may be an Earth ground (e.g., substantially 0 volts), a floating or signal ground (e.g., a non-zero voltage signal used as a reference point for measuring other signals in the amplifier architecture 200), or any other ground connection suitable for implementation in the amplifier architecture 200 as known to one of ordinary skill in the art. Furthermore, in some embodiments the ground potential 360 has a substantially same value across couplings to the ground potential 360, while in other embodiments one or more different ground potentials 360 may be implemented in the amplifier architecture 200. It should be noted that the various reference voltages discussed with reference to FIG. 3 may be provided by any suitable electrical component, as discussed above with respect to FIG. 2. It should further be noted that, while not shown in FIG. 3, the second amplifier 230 and second feedback resistor 260 may have a structure substantially similar to that of the main amplifier 210 and the first feedback resistor 250, respectively, and that a particular structure of the third amplifier 240 and the resistor controller 270 is not limited herein, as discussed above.

As discussed above, the BJT 304 is biased with the reference voltage to cause the BJT 304 to operate at substantially all times in the saturation region while the amplifier architecture 200 is active, and thus is considered as a short-circuit which may have an associated voltage drop. When the main amplifier 210 receives the input current at the base 302B of the BJT 302 having a sufficient voltage and/or current to cause the BJT 302 to turn on, the BJT 302 conducts current between the collector 302C and the emitter 302E. When the BJT 302 operates in the saturation region, it too may be considered as a short-circuit which may have an associated voltage drop and creates a complete circuit that allows current to flow from the voltage source 358 through the adjustment resistor 322, BJT 304, BJT 302, and adjustment resistor 324 to the ground potential 360. In some embodiments, the adjustment resistor 324 may be bypassed when the NMOS 314 operates in the saturation region, and thus creates a less resistant path to ground for the current flowing from the voltage source 358. Similarly, when the BJT 302 operates in the saturation region, a voltage present at the base 312B of the BJT 312 is about the value of the voltage source 358 minus a voltage drop of the feedback resistor 322 which causes the BJT 312 to operate in the saturation region and conduct current between the collector 312C and the emitter 312E. The current conducted through the BJT 312 is about equal to a bias current of the BJT 310 (e.g., a current received by the BJT 310 at the base 310B) minus a current received by the BJT 302 at the base 302B. Similarly, the current conducted by the BJT 312 is also conducted by the PMOS 318, and mirrored be conducted by the PMOS 320 between the source 320S and drain 320D.

The current conducted by the PMOS 320 between the source 320S and drain 320D flows through the load resistor 326 to create a voltage potential and control a voltage signal received by the burst-mode average detector 337 and having a current of about the bias current of the BJT 310 minus the current received by the BJT 302 at the base 302B. The burst-mode average detector 337 determines the average of the received signal potential and passes a voltage output representing the average to the amplifier 340. The amplifier 340, in some embodiments, is configured according to an operational amplifier configuration that amplifies a difference between the input received at the first input 338 and the input received at the second input 339 and provides the amplified difference as an output at the output 341. When the output of the amplifier 340 has a value sufficient to cause the NMOS 343 to operate in the saturation region, the NMOS 343 conducts current between the drain 343D and the source 343S, thereby causing a current having a value of about the bias current of the BJT 310 minus the current received by the BJT 302 at the base 302B to flow through the PMOS 346, the NMOS 343, and through the load resistor 356 to the ground potential 360. The current flowing through the PMOS 346 is mirrored to also flow through the PMOS 348 and thereby the NMOS 352. The current flowing through the NMOS 352 is mirrored to also flow through the NMOS 354, thereby causing a current having a value of about the bias current of the BJT 310 minus the current received by the BJT 302 at the base 302B to flow through the NMOS 354. As discussed above, the PMOS 350 is biased at its gate 350G with a reference voltage that causes a current conducted by the PMOS 350 to have a value of about the bias current of the BJT 310, thereby causing a current flowing from the average current detector 220 at the output 224 to have a value of about the value of the current received by the BJT 302 at the base 302B such that a current signal received by the second amplifier 230 at the main input 232 (each shown in FIG. 2) has about a same value as a current signal received by the main amplifier 210 at the main input 212.

Figure 4:
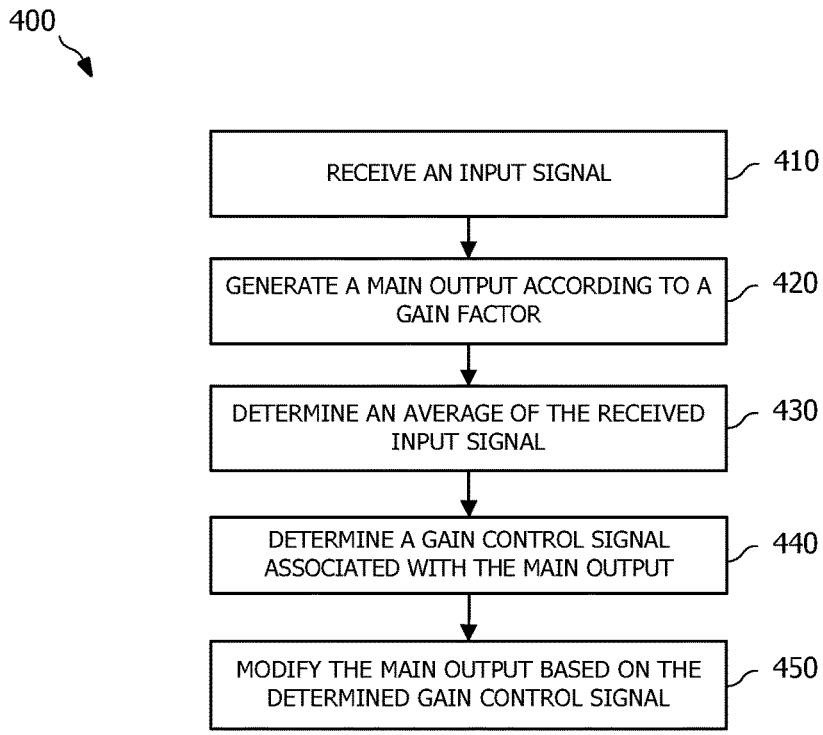
FIG. 4 is a flowchart of an embodiment of a method of automatic gain control.

Referring now to FIG. 4, a flowchart of an embodiment of a method 400 of automatic gain control is shown. The method 400 is implemented by electrical components having an automatic gain capability (e.g., an automatic gain control circuit or architecture, such as the amplifier architecture 200), when automatic gain control of an amplifier is desired. At step 410, an input signal is received. The input signal is received, for example, by a first amplifier (e.g., the main amplifier 210 of FIG. 2) from a sensor (e.g., the electrical component 280 of FIG. 2). At step 420, a main output is generated according to a gain factor. The main output is produced, for example, by the first amplifier amplifying the input signal according to the gain factor, where the gain factor is set by a first feedback resistor (e.g., the first feedback resistor 250 of FIG. 2). At step 430, an average of the received input signal is determined. The average is determined, for example, based on an auxiliary output of the first amplifier that is proportional to the input signal received by the first amplifier. The average is determined, in some embodiments, by an average current detector (e.g., the average current detector 220 of FIG. 2). At step 440, a gain control signal associated with the main output (e.g., for controlling a resistance value of the first feedback resistor) is determined according to the average of the received input signal determined at step 420. The gain control signal is determined, for example, by a feedback loop comprising a second amplifier (e.g., the second amplifier 230 of FIG. 2) configured to replicate operations of the first amplifier by amplifying the average of the received input signal according to a gain set by a second feedback resistor (e.g., the second feedback resistor 260 of FIG. 2), a third amplifier (e.g., the third amplifier 240 of FIG. 2) configured to compare an output of the second amplifier to a reference value, and optionally, a resistor controller (e.g., the resistor controller 270 of FIG. 2) configured to substantially simultaneously control the resistance value of the first feedback resistor and the second feedback resistor such that both resistance values are about equal. The gain control signal is determined, for example, by the third amplifier comparing the output of the second amplifier to the reference value and outputting a control signal based on the comparison. Optionally, the resistor controller receives the output of the third amplifier and determines one or more control signals for controlling the first feedback resistor, the second feedback resistor, the first amplifier, and/or the second amplifier. At step 450, the main output is modified based on the determined gain control signal. The main output is modified, for example, by the resistor controller adjusting (e.g., increasing or decreasing) the resistance value of the first feedback resistor and the second feedback resistor (e.g., by switching resistance into or out of a circuit utilizing one or more combinations of resistors coupled to a transistor operating as a switch, such as by controlling operation of the transistor with respect to a saturation region of the transistor, as discussed above with respect to FIG. 3) such that a gain of the first amplifier and the second amplifier is adjusted based on the gain control signal determined at step 440.

Figure 5:
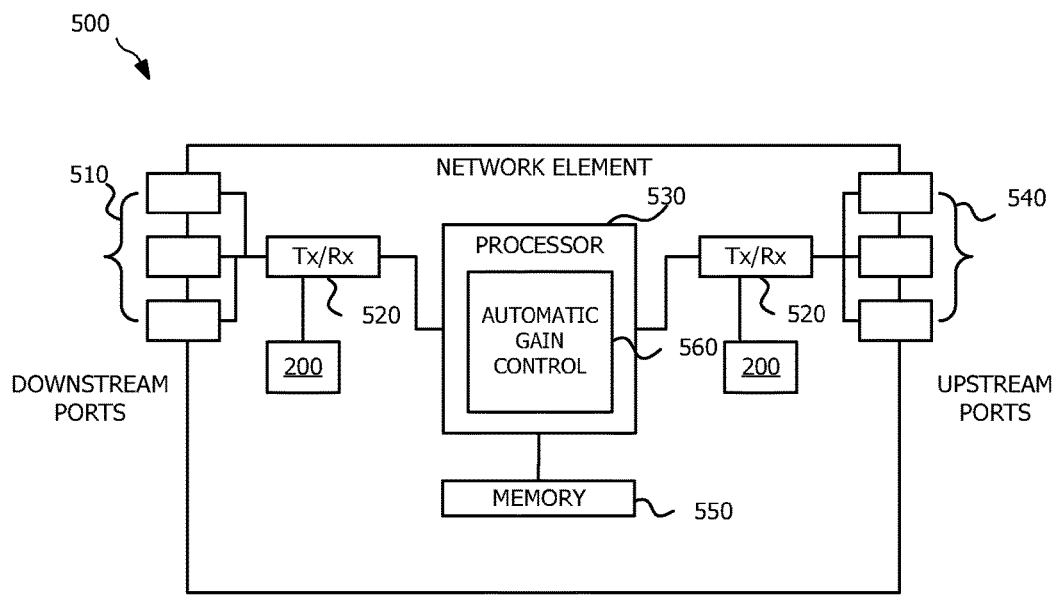
FIG. 5 is a schematic diagram of a network element according to various embodiments of the present disclosure.

Referring now to FIG. 5, a schematic diagram of a network element 500 according to various embodiments of the present disclosure is shown. Network element 500 may be any suitable processing device capable of receiving an input signal and producing an amplified output signal. For example, the network element 500 may implement the amplifier architecture 200 of FIG. 2 and operate as an OLT 110 and/or an ONU 120 of FIG. 1. In various embodiments, for instance, the features/methods of this disclosure are implemented using hardware, firmware, and/or software installed to run on hardware.

Network element 500 is a device (e.g., an access point, an access point station, a router, a switch, a gateway, a bridge, a server, a client, a user-equipment, a mobile communications device, etc.) that transports data through a network, system, and/or domain, and/or provides services to other devices in a network or performs computational functions. In one embodiment, the network element 500 is an apparatus and/or system comprising the amplifier architecture 200 disclosed herein.

The network element 500 comprises one or more downstream ports 510 coupled to a transceiver (Tx/Rx) 520, which are transmitters, receivers, or combinations thereof. The Tx/Rx 520 transmits and/or receives frames from other network elements via the downstream ports 510. Similarly, the network element 500 comprises another Tx/Rx 520 coupled to a plurality of upstream ports 540, wherein the Tx/Rx 520 transmits and/or receives frames from other nodes via the upstream ports 540. The downstream ports 510 and/or the upstream ports 540 may include electrical and/or optical transmitting and/or receiving components. In another embodiment, the network element 500 comprises one or more antennas (not shown) coupled to the Tx/Rx 520. The Tx/Rx 520 transmits and/or receives data (e.g., packets) from other computing or storage devices wirelessly via the one or more antennas. The Tx/Rx 520 may further comprise, or be coupled to, an amplifier configured to amplify a burst-mode signal received by the Tx/Rx 520, such as, for example, the amplifier architecture 200.

A processor 530 is coupled to the Tx/Rx 520 and is configured to perform communication between the network element 500 and another network element, for example, according to one or more burst-mode transmissions. In an embodiment, the processor 530 comprises one or more multi-core processors and/or memory modules 550, which functions as data stores, buffers, etc. The processor 530 is implemented as a general processor or as part of one or more application specific integrated circuits (ASICs), field-programmable gate arrays (FPGAs), and/or digital signal processors (DSPs). Although illustrated as a single processor, the processor 530 is not so limited and alternatively comprises multiple processors. The processor 530 further comprises processing logic configured to execute automatic gain control 560.

FIG. 5 also illustrates that a memory module 550 is coupled to the processor 530 and is a non-transitory medium configured to store various types of data. Memory module 550 comprises memory devices including secondary storage, read-only memory (ROM), and random-access memory (RAM). The secondary storage is typically comprised of one or more disk drives, optical drives, solid-state drives (SSDs), and/or tape drives and is used for non-volatile storage of data and as an over-flow storage device if the RAM is not large enough to hold all working data. The secondary storage is used to store programs that are loaded into the RAM when such programs are selected for execution. The ROM is used to store instructions and perhaps data that are read during program execution. The ROM is a non-volatile memory device that typically has a small memory capacity relative to the larger memory capacity of the secondary storage. The RAM is used to store volatile data and perhaps to store instructions. Access to both the ROM and RAM is typically faster than to the secondary storage.

The memory module 550 may be used to house the instructions for carrying out the various embodiments described herein. For example, the memory module 550 may comprise instructions configured to implement automatic gain control 560, which is executed by processor 530.

It is understood that by programming and/or loading executable instructions onto the network element 500, at least one of the processor 530 and/or the memory module 550 are changed, transforming the network element 500 in part into a particular machine or apparatus, for example, an amplifier architecture having the novel automatic gain control functionality taught by the present disclosure. It is fundamental to the electrical engineering and software engineering arts that functionality that can be implemented by loading executable software into a computer can be converted to a hardware implementation by well-known design rules known in the art. Decisions between implementing a concept in software versus hardware typically hinge on considerations of stability of the design and number of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable and will be produced in large volume may be preferred to be implemented in hardware (e.g., in an ASIC) because for large production runs the hardware implementation may be less expensive than software implementations. Often a design may be developed and tested in a software form and then later transformed, by design rules well-known in the art, to an equivalent hardware implementation in an ASIC that hardwires the instructions of the software. In the same manner as a machine controlled by a new ASIC is a particular machine or apparatus, likewise a computer that has been programmed and/or loaded with executable instructions may be viewed as a particular machine or apparatus.

Disclosed herein are means for automatic gain control in a closed-loop system. The disclosure includes means for closed-loop gain control for a TIA which may be operating in a burst-mode (e.g., receiving signals that include one or more bursts having a time length that can range from an order of a few tens of nanosecond to an order of tens of milliseconds). The disclosure further includes an apparatus comprising a first module configured with a means for receiving an input current, generating a first output signal according to the input current and a gain of the first module, and generating an auxiliary output proportional to the input current, a second module coupled to the first module and configured with means for receiving the auxiliary output and determining an average of the input current represented by the auxiliary output, a third module coupled to the second module and configured with means for receiving the average of the input current and generating a second output signal according to the average of the input current and a gain of the third module, and a fourth module coupled to the third module and configured with means for receiving the second output signal, comparing the second output signal to a reference signal to determine a comparison result, and controlling the gain of the first module and the gain of the second module according to the comparison result.

Additional embodiments are cited in the following clauses.

Clause 1. An apparatus, comprising:
a first amplifier configured to:
receive an input current at a main input;
generate a first amplifier output signal according to the input current and a gain of the first amplifier; and
generate an auxiliary output proportional to the input current;
an average detector coupled to the first amplifier and configured to:
receive the auxiliary output; and
determine an average of the input current represented by the auxiliary output;
second amplifier coupled to the average detector and configured to:
receive the average of the input current; and
generate a second amplifier output signal according to the average of the input current and a gain of the second amplifier;
a third amplifier coupled to the second amplifier and configured to:
receive the second amplifier output signal;
compare the second amplifier output signal to a reference signal to determine a comparison result; and
control the gain of the first amplifier and the gain of the second amplifier according to the comparison result.

Clause 2. The apparatus of clause 1, further comprising:
a first feedback resistor coupled to the first amplifier and configured to provide the gain of the first amplifier, wherein a first resistance value of the first feedback resistor is controllable;
and
a second feedback resistor coupled to the second amplifier and configured to provide the gain of the second amplifier, wherein a second resistance value of the second feedback resistor is controllable.

Clause 3. The apparatus of any of clauses 1-2, further comprising a resistor controller coupled to the third amplifier, the first feedback resistor, and the second feedback resistor, wherein the resistor controller is configured to:
receive the comparison result from the third amplifier;
determine a resistor control signal; and
control the first resistance value of the first feedback resistor and the second resistance value of the second feedback resistor according to the resistor control signal to control the gain of the first amplifier and the gain of the second amplifier.

Clause 4. The apparatus of any of clauses 1-3, wherein the resistor controller is further coupled to the first amplifier and the second amplifier, and wherein the resistor controller is further configured to control at least a portion of the first amplifier and the second amplifier according to the resistor control signal.

Clause 5. The apparatus of any of clauses 1-4, wherein the first feedback resistor and the second feedback resistor comprise a plurality of resistors, and wherein at least one of the plurality of resistors is individually controllable by the resistor controller according to the resistor control signal to control the gain of the first amplifier and the gain of the second amplifier.

Clause 6. The apparatus of any of clauses 1-5, wherein the input current is received from a photodiode.

Clause 7. The apparatus of any of clauses 1-6, wherein a structure, electrical characteristics, and mechanical characteristics of the second amplifier are the same as the first amplifier.

Clause 8. The apparatus of any of clauses 1-7, wherein the input current is a burst-mode signal received by an optical network unit.

Clause 9. An optical network system, comprising:
an optical line terminal (OLT); and
an optical network unit (ONU) coupled to the OLT and configured to communicate with the OLT via an optical signal;
wherein at least one of the OLT or the ONU comprises a closed-loop gain controlled transimpedance amplifier (TIA) comprising:
a first amplifier configured to:
receive an input signal;
generate a main output signal by amplifying the input signal according to a gain factor of the first amplifier; and
generate an auxiliary output proportional to the input signal;
an average detector coupled to the first amplifier and configured to:
receive the auxiliary output; and
determine an average of the input signal according to the auxiliary output; and
a feedback loop coupled to the first amplifier and the average detector and configured to control the gain factor of the first amplifier according to the average of the input signal.

Clause 10. The optical network system of clause 9, wherein the closed-loop gain controlled TIA further comprises a first feedback resistor coupled to the first amplifier, and wherein the gain factor of the first amplifier is determined according to a resistance value of the first feedback resistor.

Clause 11. The optical network system of any of clauses 9-10, wherein the feedback loop comprises:
a second amplifier coupled to the average detector and configured to:
receive the average of the input signal; and generate a second output signal by amplifying the average of the input signal according to a gain factor of the second amplifier;

a second feedback resistor coupled to the second amplifier, wherein the gain factor of the second amplifier is determined according to a resistance value of the second feedback resistor;

a third amplifier coupled to the second amplifier and configured to compare the second output signal to a reference signal to determine a comparison result; and a controller coupled to the third amplifier, the first feedback resistor, and the second feedback resistor and configured to:

receive the comparison result;

determine a control signal according to the comparison result; and control the resistance value of the first feedback resistor and the resistance value of the second feedback resistor according to the control signal to change the gain factor of the first amplifier.

Clause 12. The optical network of any of clauses 9-11, wherein the first amplifier and the second amplifier are identical.

Clause 13. The optical network system of any of clauses 9-12, wherein the controller is further coupled to the first amplifier and the second amplifier, and wherein the controller is further configured to control at least a portion of the first amplifier and the second amplifier according to the control signal.

Clause 14. The optical network system of any of clauses 9-13, wherein the first feedback resistor and the second feedback resistor comprise a plurality of resistors, and wherein at least one of the plurality of resistors is individually controllable by the controller according to the control signal to control the gain of the first amplifier and the gain of the second amplifier.

Clause 15. The optical network system of any of clauses 9-14, wherein the first amplifier is further coupled to a photodiode, and wherein the first amplifier receives the input signal from the photodiode.

Clause 16. A method, comprising:

receiving, by a first amplifier, an input signal;

generating, by the first amplifier, a main output according to a gain factor;

determining, by an average detector, an average of the received input signal;

determining, by a feedback loop, a gain control signal according to the average of the received input signal; and modifying, by the feedback loop, the main output based on the gain control signal.

Clause 17. The method of clause 16, wherein determining the gain control signal comprises:

receiving, by a second amplifier, the average of the received input signal;

generating, by the second amplifier, a second output according to a second gain factor;

and comparing, by a third amplifier, the second output to a reference value to determine the gain control signal.

Clause 18. The method of any of clauses 16-17, wherein modifying the main output based on the gain control signal comprises:

receiving, by a controller, the gain control signal; and modifying, by the controller, a resistance value of a feedback resistor configured to control the gain factor associated with the main output.

Clause 19. The method of any of clauses 16-18, wherein modifying the resistance value of the feedback resistor comprises controlling operation of a transistor with respect to a saturation region of the transistor.

Clause 20. The method of any of clauses 16-19, wherein the input signal is received from a photodiode.

The use of the term "couple" or "coupled" may mean a direct coupling or an indirect coupling. A first component is directly coupled to a second component when there are no intervening components, except for a line, a trace, or another medium between the first component and the second component. The first component is indirectly coupled to the second component when there are intervening components other than a line, a trace, or another medium between the first component and the second component. The term "coupled" and its variants include both directly coupled and indirectly coupled. The use of the term "about" means a range including ±10% of the subsequent number unless otherwise stated.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. An apparatus, comprising:
a first amplifier configured to:
receive an input current at a main input;
generate a first amplifier output signal according to the input current and a gain of the first amplifier; and
generate an auxiliary output proportional to the input current;
an average detector coupled to the first amplifier and configured to:
receive the auxiliary output; and
determine an average of the input current represented by the auxiliary output;
a second amplifier coupled to the average detector and configured to:
receive the average of the input current; and
generate a second amplifier output signal according to the average of the input current and a gain of the second amplifier;
a third amplifier coupled to the second amplifier and configured to:
receive the second amplifier output signal;
compare the second amplifier output signal to a reference signal to determine a comparison result; and control the gain of the first amplifier and the gain of the second amplifier according to the comparison result.

2. The apparatus of claim 1, further comprising:
a first feedback resistor coupled to the first amplifier and configured to provide the gain of the first amplifier, wherein a first resistance value of the first feedback resistor is controllable; and
a second feedback resistor coupled to the second amplifier and configured to provide the gain of the second amplifier, wherein a second resistance value of the second feedback resistor is controllable.

3. The apparatus of claim 2, further comprising a resistor controller coupled to the third amplifier, the first feedback resistor, and the second feedback resistor, wherein the resistor controller is configured to:
receive the comparison result from the third amplifier;
determine a resistor control signal; and
control the first resistance value of the first feedback resistor and the second resistance value of the second feedback resistor according to the resistor control signal to control the gain of the first amplifier and the gain of the second amplifier.

4. The apparatus of claim 3, wherein the resistor controller is further coupled to the first amplifier and the second amplifier, and wherein the resistor controller is further configured to control at least a portion of the first amplifier and the second amplifier according to the resistor control signal.

5. The apparatus of claim 3, wherein the first feedback resistor and the second feedback resistor comprise a plurality of resistors, and wherein at least one of the plurality of resistors is individually controllable by the resistor controller according to the resistor control signal to control the gain of the first amplifier and the gain of the second amplifier.

6. The apparatus of claim 1, wherein the input current is received from a photodiode.

7. The apparatus of claim 1, wherein a structure, electrical characteristics, and mechanical characteristics of the second amplifier are the same as the first amplifier.

8. The apparatus of claim 1, wherein the input current is a burst-mode signal from a photodiode in an optical network unit.

9. An optical network system, comprising:
an optical line terminal (OLT); and
an optical network unit (ONU) coupled to the OLT and configured to communicate with the OLT via an optical signal;
wherein at least one of the OLT or the ONU comprises a closed-loop gain controlled transimpedance amplifier (TIA) comprising:
a first amplifier configured to:
receive an input signal;
generate a main output signal by amplifying the input signal according to a gain factor of the first amplifier; and
generate an auxiliary output proportional to the input signal;
an average detector coupled to the first amplifier and configured to:
receive the auxiliary output; and
determine an average of the input signal according to the auxiliary output;
a second amplifier coupled to the average detector and configured to:
receive the average of the input signal; and
generate a second output signal by amplifying the average of the input signal according to a gain factor of the second amplifier; and
a feedback loop coupled to the first amplifier, the second amplifier, and the average detector and configured to control the gain factor of the first amplifier according to a comparison between the second output and a reference value.

10. The optical network system of claim 9, wherein the closed-loop gain controlled TIA further comprises a first feedback resistor coupled to the first amplifier, and wherein the gain factor of the first amplifier is determined according to a resistance value of the first feedback resistor.

11. The optical network system of claim 10, wherein the feedback loop comprises:
a second feedback resistor coupled to the second amplifier, wherein the gain factor of the second amplifier is determined according to a resistance value of the second feedback resistor;
a third amplifier coupled to the second amplifier and configured to compare the second output signal to a reference signal to determine a comparison result; and
a controller coupled to the third amplifier, the first feedback resistor, and the second feedback resistor and configured to:
receive the comparison result;
determine a control signal according to the comparison result; and
control the resistance value of the first feedback resistor and the resistance value of the second feedback resistor according to the control signal to change the gain factor of the first amplifier.

12. The optical network of claim 9, wherein the first amplifier and the second amplifier are identical.

13. The optical network system of claim 11, wherein the controller is further coupled to the first amplifier and the second amplifier, and wherein the controller is further configured to control at least a portion of the first amplifier and the second amplifier according to the control signal.

14. The optical network system of claim 11, wherein the first feedback resistor and the second feedback resistor comprise a plurality of resistors, and wherein at least one of the plurality of resistors is individually controllable by the controller according to the control signal to control the gain of the first amplifier and the gain of the second amplifier.

15. The optical network system of claim 9, wherein the first amplifier is further coupled to a photodiode, and wherein the first amplifier receives the input signal from the photodiode.

16. A method, comprising:
receiving, by a first amplifier, an input signal;
generating, by the first amplifier, a main output according to a gain factor;
determining, by an average detector, an average of the received input signal;
generating, by a second amplifier, a second output according to a second gain factor in response receiving the average of the received input signal;
determining, by a feedback loop, a gain control signal based on a comparison between the second output and a reference value; and
modifying, by the feedback loop, the main output based on the gain control signal.

17. The method of claim 16, wherein determining the gain control signal comprises comparing, by a third amplifier, the second output to a reference value to determine the gain control signal.

18. The method of claim 17, wherein modifying the main output based on the gain control signal comprises:
    receiving, by a controller, the gain control signal; and
    modifying, by the controller, a resistance value of a feedback resistor configured to control the gain factor associated with the main output.

19. The method of claim 18, wherein modifying the resistance value of the feedback resistor comprises controlling operation of a transistor with respect to a saturation region of the transistor.

20. The method of claim 16, wherein the input signal is received from a photodiode.

* * * * *

UNITED STATES PATENT AND TRADEMARK OFFICE
CERTIFICATE OF CORRECTION

PATENT NO. : 10,079,584 B1
APPLICATION NO. : 15/458698
DATED : September 18, 2018
INVENTOR(S) : Lei Jing et al.

It is certified that error appears in the above-identified patent and that said Letters Patent is hereby corrected as shown below:

In the Claims

Column 26, Lines 33-34, Claim 12 should read:
12. The optical network system of claim 9, wherein the first amplifier and the second amplifier are identical.

Column 26, Lines 50-63, Claim 16 should read:
16. A method, comprising:
    receiving, by a first amplifier, an input signal;
    generating, by the first amplifier, a main output according to a gain factor;
    determining, by an average detector, an average of the received input signal;
    generating, by a second amplifier, a second output according to a second gain factor in response to receiving the average of the received input signal;
    determining, by a feedback loop, a gain control signal based on a comparison between the second output and a reference value; and
    modifying, by the feedback loop, the main output based on the gain control signal.

Signed and Sealed this
Twenty-third Day of October, 2018

Andrei Iancu
*Director of the United States Patent and Trademark Office*